United States Patent [19]

Marumo

[11] Patent Number: 5,203,547
[45] Date of Patent: Apr. 20, 1993

[54] VACUUM ATTRACTION TYPE SUBSTRATE HOLDING DEVICE

[75] Inventor: Mitsuji Marumo, Sagamihara, Japan

[73] Assignee: Canon Kabushiki Kaisha, Tokyo, Japan

[21] Appl. No.: 798,812

[22] Filed: Nov. 27, 1991

[30] Foreign Application Priority Data

Nov. 29, 1990 [JP] Japan .................. 2-326002
May 8, 1991 [JP] Japan .................. 3-131618

[51] Int. Cl.$^5$ ............................. B25B 11/00
[52] U.S. Cl. .................................... 269/21
[58] Field of Search ............ 269/21, 266, 309, 900;
51/235; 279/3 R; 409/225, 219, 161

[56] References Cited

U.S. PATENT DOCUMENTS

| 3,729,206 | 4/1973 | Cachon et al. .............. 269/21 |
| 3,907,268 | 9/1975 | Hale .......................... 269/21 |
| 4,444,492 | 4/1984 | Lee ............................ 269/21 |
| 4,693,458 | 9/1987 | Lewecke et al. ........... 269/21 |

FOREIGN PATENT DOCUMENTS 0269128  6/1988  European Pat. Off. .
0357424  3/1990  European Pat. Off. .
1-14703  3/1989  Japan .
2-100311 4/1990  Japan .
2225768  6/1990  United Kingdom .

Primary Examiner—Robert C. Watson
Attorney, Agent, or Firm—Fitzpatrick, Cella, Harper & Scinto

[57] ABSTRACT

A vacuum attraction type substrate holding system includes a vacuum source; a distributor for distributing a vacuum from the vacuum source into plural vacuum lines; a plurality of vacuum attraction type substrate holding portions corresponding to the vacuum lines, respectively, each of the substrate holding portions having a valve which is openable and closable for control of the supply of vacuum to the corresponding substrate holding portions, wherein the opening or closing of each valve is influential to control attraction or release of a substrate to or from a corresponding substrate holding portion; and a plurality of restriction valves each being disposed between the distributor and corresponding one of the valves, for serving as a resistance to a gas flowing from the corresponding valve.

21 Claims, 5 Drawing Sheets

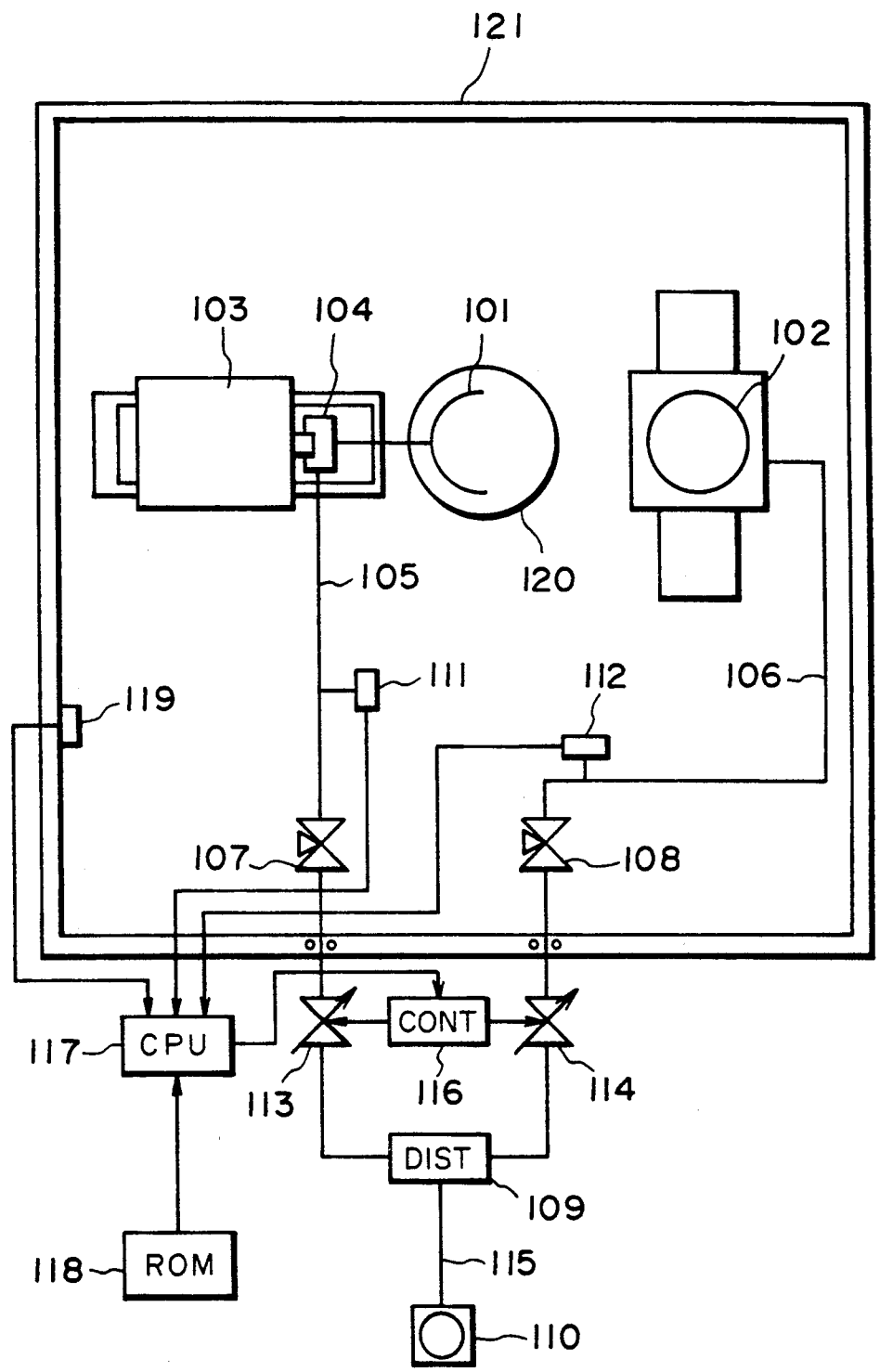
F I G. 3

1

VACUUM ATTRACTION TYPE SUBSTRATE HOLDING DEVICE

FIELD OF THE INVENTION AND RELATED ART

This invention relates to a vacuum attraction type substrate holding device and a method therefor, for use in a semiconductor exposure apparatus, for example a.

FIG. 5 shows a known example of substrate holding device for holding a wafer through vacuum attraction.

In this example, a conveying chuck 51 for attracting and holding a wafer 61 is mounted to a substrate conveying device which comprises a Z-stage 54 for moving the conveying chuck 51 in a Z-axis direction (perpendicular to the sheet of the drawing) and an X-stage 53 for moving the conveying chuck in an X-axis direction (lateral direction as viewed in the drawing). With the movement of the substrate conveying device, the wafer can be transferred between the conveying chuck 51 and a wafer chuck 52 adapted, like the conveying chuck 51, to attract and hold the wafer 61 for exposure thereof. The substrate conveying device and the conveying chuck 51 as well as the wafer chuck 52 are placed in a vacuum chamber 62 filled with a reduced pressure ambience.

The conveying chuck 51 is communicated with a pump 60 through a vacuum line 55, a valve 57 and a distributor 59. On the other hand, the wafer chuck 52 is communicated with the pump 60 through a vacuum line 56, a valve 58 and the distributor 59. Thus, both of the conveying chuck 51 and the wafer chuck 52 are operable to attract/release the wafer 61 in response to the pumping operation of the pump 60. The valves 57 and 58 each comprises a three-way valve, and are selectively operable in (a) a first state for communicating the conveying chuck 51 and the wafer chuck 52 with the pump 60, respectively, and (b) a second state for communicating the conveying chuck 51 with the ambience within the vacuum chamber 62 (hereinafter "chamber ambience") and communicating the wafer chuck 52 with the chamber ambience, respectively.

Here, description will now be made of transfer of a wafer 61 from the conveying chuck 51 to the wafer chuck 52.

First, for attraction of the wafer 61 by the conveying chuck 51, the valve 57 is turned into the state (a), that is, allowing communication of the conveying chuck 57 with the pump 60. Then, the pump 60 is operated to execute attraction and holding of the wafer 61 through the conveying chuck 51. At this time, the valve 58 is kept in the state (b), whereby the wafer chuck 52 is kept in communication with the chamber ambience and the pressure in the vacuum line 56 is kept at the same pressure as the chamber ambience pressure.

Next, the X-stage 53 is driven to move the wafer 61, held by the conveying chuck by attraction, to a position above the chucking surface of the wafer chuck 52. Thereafter, the Z-stage 54 is driven to move the conveying chuck to a position whereat the wafer 61 contacts the chucking surface of the wafer chuck 52. Then, in the state in which the wafer 61 is in contact with the chucking surface of the wafer chuck 52, the valve 58 is turned into the state (a), whereby the wafer 61 is attracted to the wafer chuck 52. At this time, the wafer 61 is attracted both to the wafer chuck 52 and to the conveying chuck 51 and, therefore, the valve 57 is turned into the state (b) so as to provide communication of the conveying chuck 51 with the chamber ambience, to thereby cancel the attracting force of the conveying chuck. By this, the wafer 61 is disengaged from the conveying chuck 51. After the wafer 61 is brought into a state in which it is attracted only by the wafer chuck 52, the Z-stage 54 and the X-stage 53 are driven sequentially so as to return the conveying chuck 51 to its original position, and thus the transfer of the wafer 61 to the wafer chuck 52 is completed.

When the exposure of the wafer 61 held by the wafer chuck 52 is completed, the X-stage and the Z-stage 54 are driven again so as to move the conveying chuck 51 to the position of the wafer chuck 52, and the transfer of the wafer 61 from the wafer chuck 52 to the conveying chuck 51 is executed. In this case, through an operation made in an inverse order as the operation of wafer transfer from the conveying chuck 51 to the wafer chuck 52, the wafer 61 can be transferred to the conveying chuck 51 from the wafer chuck 52.

SUMMARY OF THE INVENTION

With this known example, however, for transfer of a substrate between adjacent substrate holding devices, e.g., for transfer of a wafer from the conveying chuck 51 to the wafer chuck 52 as described, the valve 58 is switched to cause communication of the wafer chuck 52 with the pump 60 in order to turn the wafer chuck 52 into an attracting state. Since, however, at that time the vacuum line 56 communicated with the wafer chuck 52 already has the same pressure as the chamber ambience, in response to the switching of the valve 58 a gas of high pressure flows into the distributor 59 and, as a result, the distributor 59 pressure rises. This reduces the attracting force and causes a possibility of insufficient differential 5 pressure between the conveying chuck 51 and the chamber ambience, leading to undesirably dropping the substrate.

It is accordingly a primary object of the present invention to provide a vacuum attraction type substrate holding device by which, for attraction and holding of a substrate, a sufficient differential pressure is maintained between an ambience pressure and an attracting pressure when the substrate is attracted and held by the substrate holding device.

In an arrangement according to the present invention, an attraction line of an attraction source, for vacuum attraction, is distributed and coupled to a plurality of vacuum attraction type substrate holding means, and valve means is interposed to control engagement/disengagement of a substrate to/from each substrate attracting means. Between the distributor and the valve means, a restriction (throttle) valve is interposed and, additionally, between the substrate holding means and the valve means, a vacuum sensor is interposed to detect the attracting pressure of that substrate holding device.

In the vacuum attraction type substrate holding device of this aspect of the present invention, during a period in which one vacuum attraction type substrate holding means holds a substrate, the restriction valve serves to prevent flow of a gas of high pressure from another vacuum attraction type substrate holding means thereinto. Since this restriction valve is interposed between the valve means and the distributor, for removal of a difference between the ambience pressure and the attracting pressure of the substrate holding device for disengagement of a substrate from that substrate holding device, the gas can be flow without passing the restriction valve.

In another aspect, in the example described hereinbefore, both of the conveying chuck and the wafer chuck are coupled to a common attraction source, and the attracting pressure is the same and constant when they attract a substrate. This causes some inconveniences such as follows:

(I) The limit differential pressure dPL for attraction of a substrate depends on the factors such as below:
 (1) weight of substrate;
 (2) surface roughness of substrate;
 (3) flatness of substrate;
 (4) surface roughness of attracting surface of substrate holding device;
 (5) flatness of attracting surface of substrate holding device; and
 (6) area of attracting surface of substrate holding device.

When the attracting pressure is set to be equal to the limit differential pressure dPL for execution of holding, transfer and conveyance of a substrate, there is a possibility of disengagement of the substrate from the chucking surface if a resist coating extends around the edge to the bottom of the substrate or if foreign particles are adhered to the attracting surface.

On the other hand, if the attracting pressure is set to be equal to the maximum pressure difference, it takes a long time period until that attracting pressure is established. This causes a decrease of throughput.

(II) In conveyance of a substrate, if high-speed conveyance is to be ensured, it needs a large conveyance speed and a large acceleration until that conveyance speed is reached. This necessitates a large differential pressure between the ambience pressure and the attracting pressure of the conveying chuck, for prevention of dropping the substrate. On the other hand, when such a device is incorporated into a semiconductor device manufacturing exposure apparatus which uses ultraviolet rays or X-rays, there is a necessity of removing heat generated in a mask by irradiation of the same with X-rays or the like to a temperature-controlled wafer chuck. To this end, a space between the mask and a wafer or a clearance between the wafer and the wafer chuck may be filled with a gas of helium for enhanced heat transmission efficiency. However, if the differential pressure of the conveying chuck is made large as described, the degree of vacuum in the clearance between the wafer and the wafer chuck increases, resulting in a decrease of helium gas. This causes an increase in the thermal contact resistance and thus a decrease in the heat transmission efficiency. Also, even if a suitable differential pressure is set to provide a decreased thermal contact resistance, a change in pressure causes a corresponding change in the thermal contact resistance and thus a change in the mask temperature which directly results in exposure.

(III) When a plurality of substrate holding means such as a conveying chuck, a wafer chuck and the like are used, among them there is a difference with respect to the area of the attracting surface, the surface roughness of the holding surface and the like. Therefore, using the same pressure results in differences in the attracting force.

It is accordingly another object of the present invention to provide a substrate holding method usable with an exposure apparatus having a plurality of substrate holding means, by which an enhanced reliability is assured with respect to the substrate holding.

In a substrate holding method according to this aspect of the present invention, which is usable with an exposure apparatus having a plurality of vacuum attraction type substrate holding means, for a step of transferring a substrate between two substrate holding means, for a step of conveyance of the substrate or for a step of execution of exposure of the substrate, the attracting pressure of a corresponding substrate holding means is controlled to an optimum level which is predetermined with respect to that step. Such an optimum attracting pressure may be determined in the relation to an ambience pressure or it may be determined in relation to a corresponding substrate holding means.

Since, in the substrate holding method according to this aspect of the present invention, when used with a plurality of vacuum attraction type substrate holding means, for a step of transferring a substrate between two substrate holding means, for a step of conveyance of the substrate or for a step of execution of exposure of the substrate, the attracting pressure of a corresponding substrate holding means is controlled to an optimum level which is predetermined with respect to that step, as described, assured holding of the substrate by the corresponding substrate holding means is attainable. Also, this ensures smooth execution of each step.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view of another embodiment of a vacuum attraction type substrate holding device of the present invention, which is incorporated into a semiconductor exposure apparatus.

DESCRIPTION OF THE PREFERRED EMBODIMENTS

Figure 1:
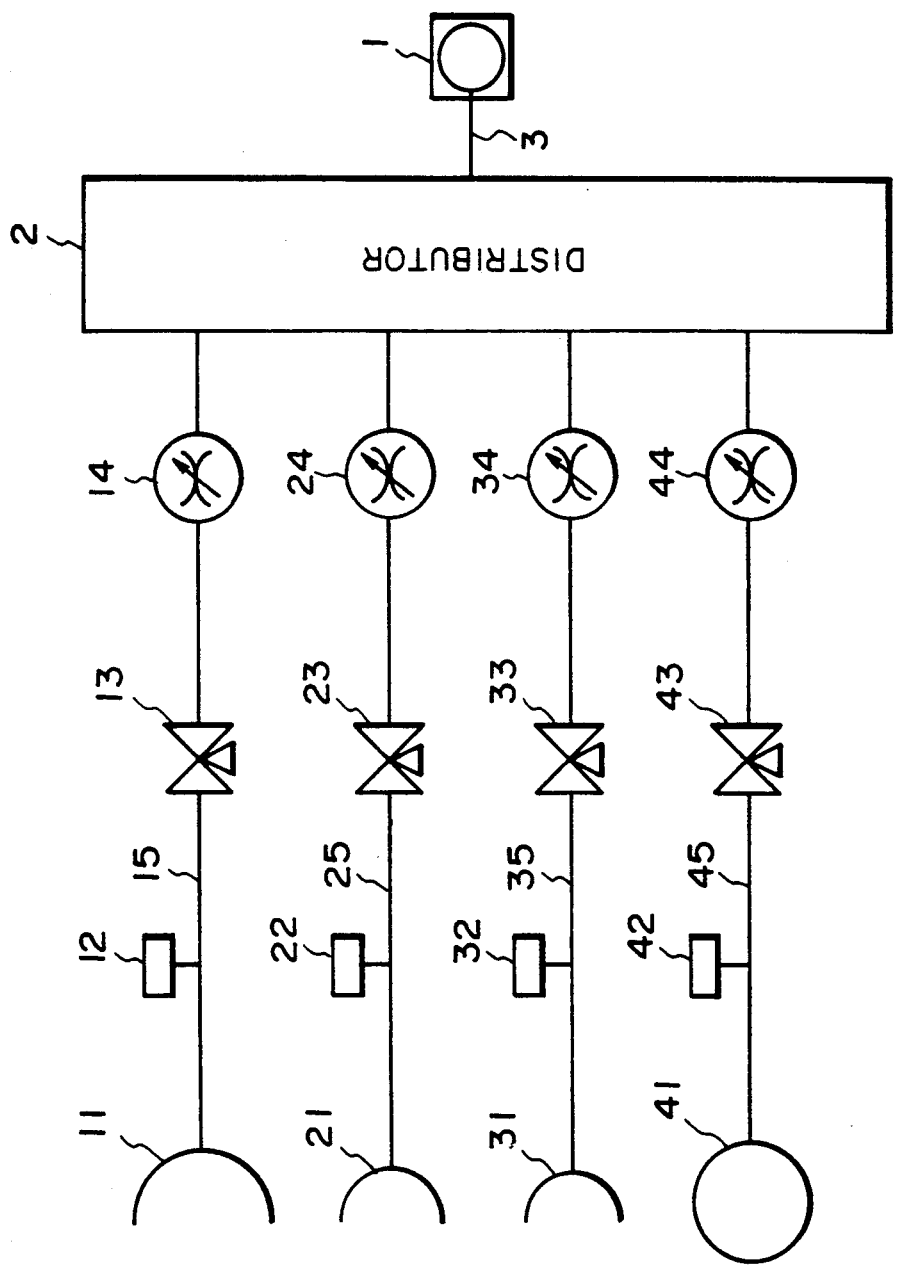
FIG. 1 is a schematic view of a vacuum attraction type substrate holding device according to an embodiment of the present invention.

FIG. 1 shows an embodiment of a vacuum attraction type substrate holding device according to the present invention.

Figure 5:
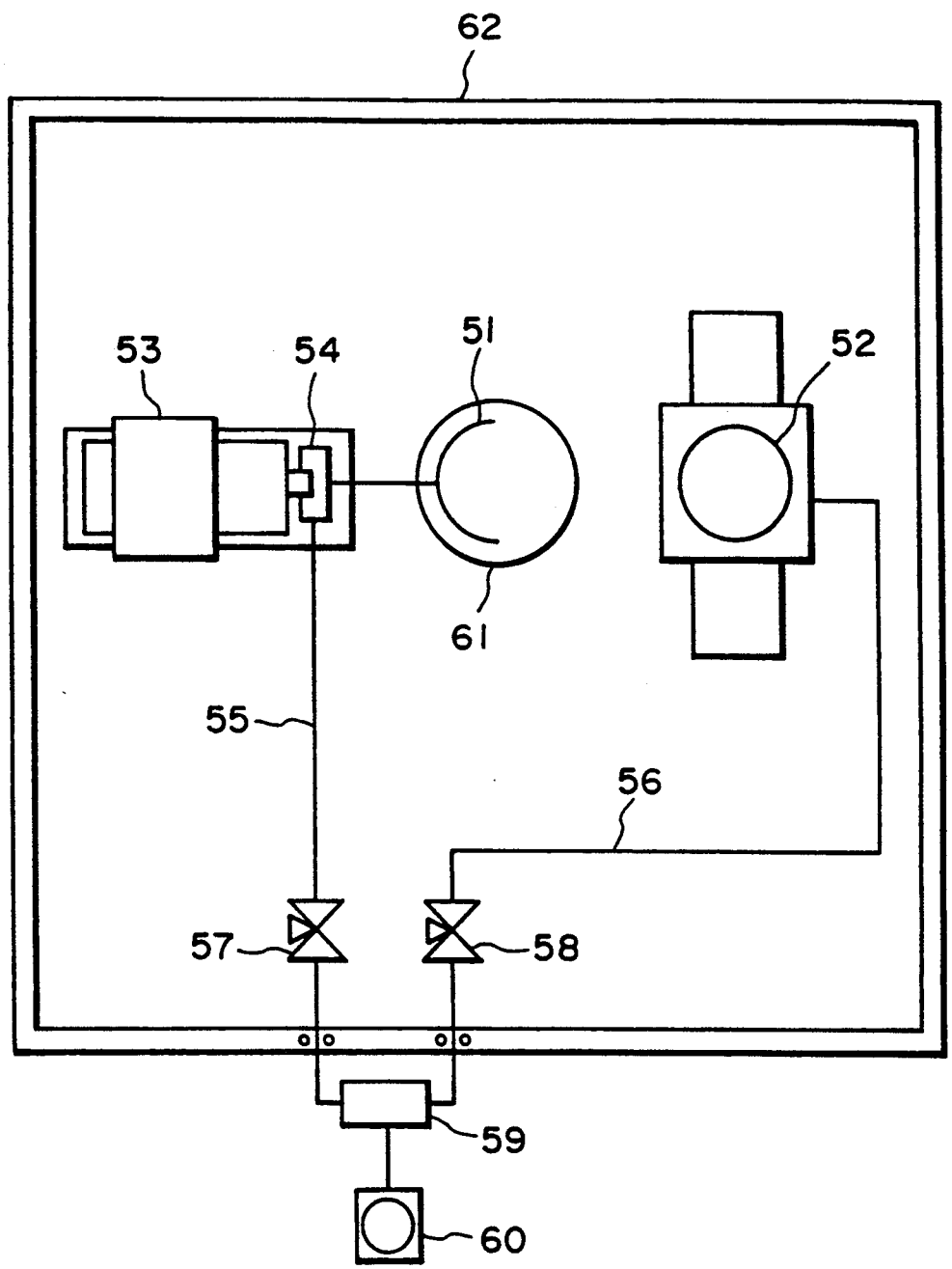
FIG. 5 is a schematic view of a known example of a vacuum attraction type substrate holding device.

In this embodiment, four vacuum attraction type substrate holding means (conveying chucks II, 21 and 31 and a wafer chuck 41) are accommodated in a vacuum chamber such as shown in FIG. 5. During pumping operation of a pump 1 disposed outside the vacuum chamber, the conveying chucks 11, 21 and 31 as well as the wafer chuck 41 are operable for engagement/disengagement of a substrate, for conveyance of the substrate and for transfer of the substrate therebetween, in response to opening/closing of valves 13, 23, 33 and 43, respectively, which are disposed on vacuum lines 15, 25, 35 and 45, respectively, being communicated with these chucks, respectively.

An attraction line 3 of the pump 1 is coupled to a distributor 2, whereby it is distributed to the four vacuum lines 15, 25, 35 and 45 communicated with the conveying chucks 11, 21 and 31 and the wafer chuck 41, respectively. On each of the vacuum lines 15-45, a restriction (throttle) valve 14 (24, 34, 44) and a valve 13 (23, 33, 43) are disposed in an order from the distributor 2 side. Additionally, between the valve 13 (23, 33, 43) and the chuck 11 (21, 31, 41), there is provided a vacuum sensor 12 (22, 32, 42) for detection of the attracting pressure of the corresponding substrate holding means. Each of the valves 13, 23, 33 and 43 comprises a three-way valve and serves to switch the corresponding chuck 11, 21, 31 or 41 between a state (a) in which that chuck is allowed to be communicated with the pump 1 and another state (b) in which that chuck is opened to the inside ambience pressure of the vacuum chamber. When during the pumping operation of the pump 1 each of the valves 13, 23, 33 and 43 is turned into the state (a), each of the conveying chucks 11, 21 and 31 as well as the wafer chuck 41 can attract a substrate. When on the other hand each valve 13, 23, 33 or 43 is turned into the state (b), the attraction of &he substrate is released whereby the substrate can be disengaged from a corresponding chuck.

The restriction valves 14, 24, 34 and 44 each is provided so as to suppress a pressure rise (when any of the valves 13, 23, 33 and 43 is opened/closed) which otherwise might be caused in a corresponding one of "the other" chucks (conveying chucks or wafer chuck).

Figure 2:
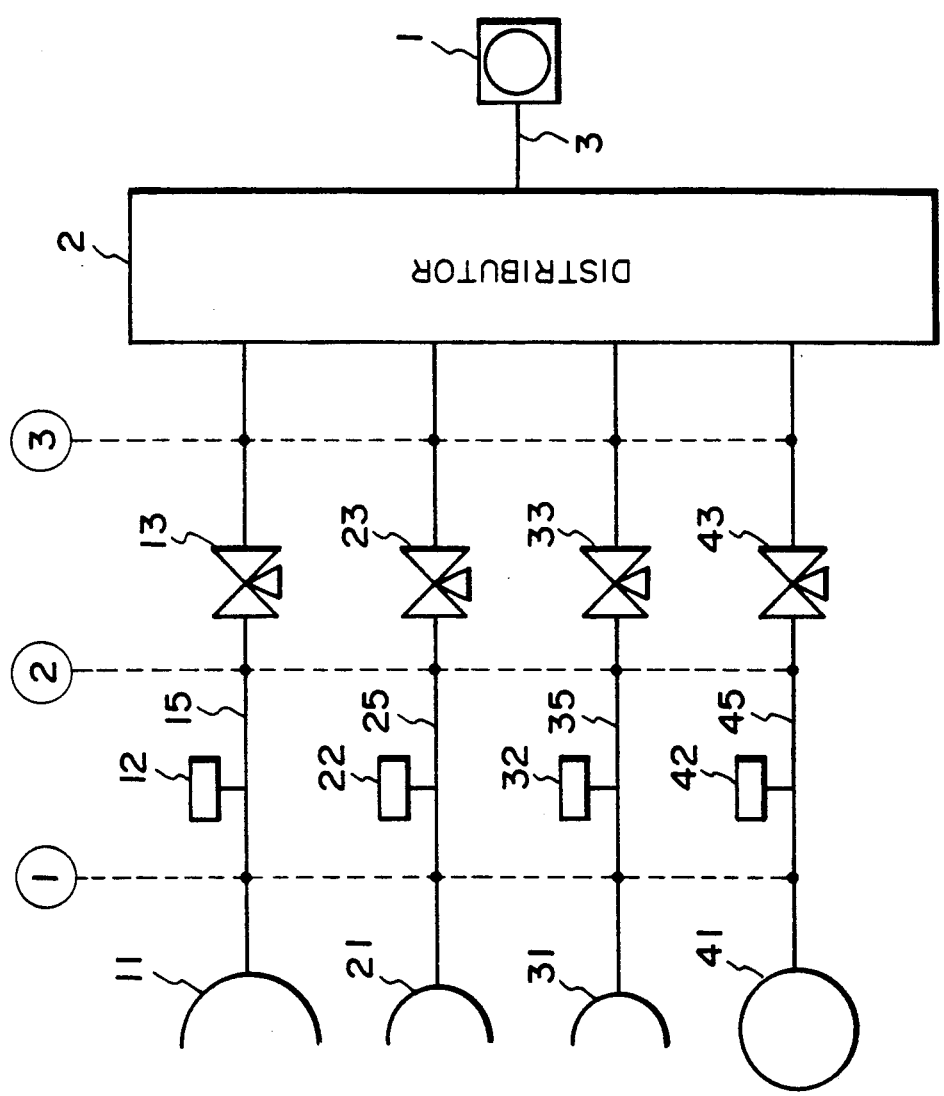
FIG. 2 is a schematic view for explaining a disposition of restriction valves.

As regards the site whereat the restriction valve 14 (24, 34, 44) can be disposed, on the vacuum line 15 (25, 35, 45) on which the valve 13 (23, 33, 43) is provided, as shown in FIG. 2, there are three possible examples: that is, (i) a position (position (1) in FIG. 2) between the conveying Chuck 11 (21, 31) and the wafer chuck 41 and the vacuum sensor 12 (22, 32, 42); (ii) a position (position (2) in FIG. 2) between the vacuum sensor 12 (22, 32, 42) and the valve 13 (23, 33, 43); and (iii) a position (position (3) in FIG. 2) between the valve 13 (23, 33, 43) and the distributor 2. In this preferred form of the present invention, the restriction valve 14 (24, 34, 44) is disposed at a position (position (3) in FIG. 2) between the valve 13 (23, 33, 43) and the distributor 2.

Here, description will be made of the three cases of the disposition of the restriction valve at each of the three positions.

In the case of the position (1), due to the restriction valve, a pressure decreased portion is defined between each chuck and the vacuum sensor. As a result, the vacuum sensor does not represent the vacuum pressure of a corresponding chuck, but it represents the pressure of a portion at the pump side of the restriction valve, having a higher degree of vacuum. In this case, therefore, there is a high possibility that the vacuum pressure at the chucking surface does not reach level required to attract the substrate and thus the differential pressure to the ambience pressure is insufficient, causing dropping of the substrate.

If the restriction valve is disposed at the position (2), the vacuum sensor is at the chuck side of the restriction valve. Thus, it can represent the vacuum pressure of a corresponding chuck. However, when the valve 13 (23, 33, 43) is switched to release, the attraction of the substrate by the chuck, since the restriction valve is at the chuck side of the valve 13 (23, 33, 43), a prolonged time is necessary until the ambience pressure level is reached. This causes decreased throughput.

When the restriction valve is disposed at the position (3), the vacuum sensor is at the chuck side of the restriction valve and, therefore, it can represent the vacuum pressure of a corresponding chuck. Additionally, when the valve 13 (23, 33, 43) is opened, since that valve is at the chuck side, the pressure at the corresponding chucking surface can reach the ambience pressure level in a short time. Thus, the inconveniences involved in the cases of the positions (1) and (2) are removed, and best results are obtainable.

Next, the substrate transfer operation according to the present invention will be explained.

In this embodiment, three conveying chucks 11, 21 and 31 as well as one wafer chuck 41 are used. Since, however, the transfer of a substrate between chucks can be done essentially in the same manner, description will now be made only on the transfer of a substrate from the conveying chuck 11 to the conveying chuck 21.

First, the pump 1 is energized into a pumping state, and the valve 13 on the vacuum line 15 coupled to the conveying chuck 11 is turned into the state (a). In this state, the conveying chuck 11 is in communication with the pump 1, whereby an attracting force is produced and thus a wafer 61 is attracted and held to it. Here, the remaining valves 23, 33 and 43 are kept in the state (b) and, thus, the conveying chucks 21 and 31 as well as the wafer chuck 41 are kept substantially at the inside ambience pressure level of the vacuum chamber.

When in this state the substrate is going to be transferred from the conveying chuck 11 to the conveying chuck 21, the valve 23 disposed on the vacuum line 25 coupled to the conveying chuck 21 is turned into the condition (a), to provide communication between the conveying chuck 21 and the pump 1 to thereby cause the conveying chuck 21 to produce an attracting force. Since the pressure of the conveying chuck 21, just before this, is kept at substantially the safe level as the inside ambience pressure of the vacuum chamber, a gas of higher pressure flows from the conveying chuck 21 to the distributor 2 through the vacuum line 25. Due to this higher pressure gas, the attracting pressure of the conveying chuck 21, holding the substrate by attraction, increases and thus the attracting force decreases, causing a possibility of dropping the substrate being held. However, under the influence of the restriction valve 14 disposed on the vacuum line 15 of the conveying chuck 11, between the distributor 2 and the valve 13, it is possible to reduce the effect of the higher pressure gas on the conveying chuck 21 side.

In this case, by making the conductance of the restriction valve 14 smaller, it is possible to make the adverse effect smaller. However, it is necessary to take into account a resultant reduction in throughput, upon determining a sufficient differential pressure between the attracting surface of the conveying chuck and the inside ambience pressure of the chamber for attraction and holding of a substrate.

Next, by means of the conveying chuck 11, the substrate held by attraction is moved onto the attracting surface of the conveying chuck 21, whereby the substrate is attracted by both the conveying chucks 11 and 12.

Subsequently, in order to allow that the substrate is held by the conveying chuck 21 only the valve 13 is turned into the state (b) to thereby remove the differential pressure between the pressure at the attracting surface of the conveying chuck 11 and the inside ambience pressure of the vacuum chamber. Here, if on the vacuum line 15 coupled to the conveying chuck 11 the restriction valve 14 is located at the conveying chuck 11 side of the valve 13, it takes a longer time until the differential pressure is eliminated. In this embodiment, however, since it is disposed at the pump 1 side of the valve 13, there is no problem.

By eliminating the differential pressure between the chamber ambience pressure and the attracting surface of the conveying chuck 11, in this manner, the attraction of the conveying chuck is released whereby the substrate is attracted and held by the conveying chuck 21 only Thus, the transfer of the substrate is completed.

With this arrangement of the present embodiment, the following advantageous effects are attainable:

(1) When a substrate is attracted and held by one vacuum attraction type substrate holding means, it is possible to prevent flow of a higher pressure gas thereinto from another vacuum attraction type substrate holding means. Therefore, it is possible to constantly maintain the differential pressure between the ambience pressure and the attracting pressure of the vacuum attraction type substrate holding means at a level sufficient for the attraction and holding of the substrate. Thus, safe and assured conveyance of a substrate by the vacuum attraction type substrate holding means or safe and assured transfer or the like of the substrate between plural substrate holding means, is attainable.

(2) On the vacuum piping means, the restriction valve is disposed between a valve and a distributor. Thus, when the valve is actuated to make the attracting pressure of a vacuum attraction type substrate holding means substantially equal to the ambience pressure for release of the substrate from that substrate holding means, the gas can flow without passing the restriction valve. This ensures increased throughput.

(3) Disposing a vacuum sensor between a valve and a vacuum attraction type substrate holding means assures correct detection of an attracting pressure of the vacuum attraction surface. Thus, it is possible to check the quality of attraction of the substrate by that substrate holding means. Therefore, the safeness and the assuredness of the substrate conveyance or substrate transfer operation is enhanced, thus resulting in an improved reliability of the substrate holding device.

FIG. 3 shows another embodiment of the present invention.

In this embodiment, the invention is applied to a semiconductor device manufacturing exposure apparatus wherein a conveying chuck 101 and a wafer chuck 102, each being vacuum attraction type substrate holding means for holding by attraction a wafer 120 for semiconductor exposure, are accommodated in a vacuum chamber 121. In this embodiment, the attracting pressure of each chuck is controlled.

The conveying chuck 101 and the wafer chuck 102 are coupled to a pump (vacuum attraction source) 110, disposed outside the vacuum chamber 121, by means of an attraction line 115 of the pump and two respective vacuum lines 105 and 106 distributed from a distributor 109.

Provided on the vacuum line 105 and within the vacuum chamber 121 are a first vacuum sensor 111 for detecting the pressure at the wafer attracting surface of the conveying chuck 101 and a first valve 107 comprising a three-way valve, in the named order from the conveying chuck 101 side. Also, outside the vacuum chamber 121, there is provided a first restriction valve 113 which serves as a means for changing the wafer attracting surface pressure of the conveying chuck 101.

Provided on the other vacuum line 106 and within the vacuum chamber 121 are a second vacuum sensor 112 for detecting the pressure at the wafer attracting surface of the wafer chuck 102 and a second valve 108 comprising a three-way valve, in the named order from the wafer chuck 102 side. Also, outside the vacuum chamber 121, there is provided a second restriction valve 114 which serves as a means for changing the wafer attracting surface pressure of the wafer chuck 102.

The valves 107 and 108 each serves to selectively turn the conveying chuck 101 (wafer chuck 102) into a state (a) in which the chuck is communicated with the pump 110 and a state (b) in which the conveying chuck 101 (wafer chuck 102) opens to the chamber inside ambience of the vacuum chamber 121. By switching the first valve 107 (second valve 108) into the state (a) during the pumping operation of the pump 110, a differential pressure is produced between the chamber inside ambience pressure and the wafer attracting surface of the conveying chuck 101 (wafer chuck 102), whereby a wafer 120 can be attracted thereto. Also, by switching the first valve 107 (second valve 108) into the state (b), the pressure at the wafer attracting surface of the conveying chuck 101 (wafer chuck 102) can be made substantially equal to the chamber inside ambience pressure, such that the wafer 20 cannot be attracted to it.

Throttle valves 113 and 114 each has a variable degree of opening which is controlled through a controller 116 by means of a central processing unit (CPU) 117 which serves as a restriction control means. In accordance with the controlled degree of opening, the attracting pressure of the conveying chuck 101 (wafer chuck 102) to the wafer 120 is determined.

The conveying chuck 101 is mounted to a substrate conveying device which includes an X-stage 103 for moving the conveying chuck 101 in the X-axis direction (lateral direction as viewed in the drawing) and a Z-stage 104 for moving the conveying chuck in the Z-axis direction (perpendicular to the sheet of the drawing). The conveying chuck can be moved by this substrate conveying device, for transfer of a wafer 120 between it and the wafer chuck 102 or a wafer cassette (not shown) for accommodating the wafer 120.

The wafer chuck 102 can be moved, while attracting and holding a wafer 120, by means of a conveying device (not shown) from the position for wafer transfer with the conveying chuck 101 to a predetermined exposure position for exposure of the wafer.

In this embodiment, as for the step of controlling the attracting pressure of the conveying chuck 101, the transfer and conveyance of a wafer to the wafer cassette and the transfer and conveyance of a wafer to the wafer chuck 102, both to be done in the vacuum chamber 121 as well as the transfer and conveyance of a wafer to the wafer cassette to be done in an atmospheric pressure, will be discussed. Also, as regards the wafer chuck 102, the conveyance of a wafer to the exposure operation and the exposure operation at the exposure position will be discussed.

For each step as described, an optimum level of the attracting pressure is predetermined as a set level, and such a set level is memorized beforehand into a memory means 118 such as a read-only-memory (ROM).

Optimum attracting pressures for these steps are shown in Table 1, below:

mum attracting pressures P4 and P4w are so determined, while taking into account this, to sufficiently

TABLE 1

| No. | AMBIENCE PRESSURE | OPERATION | ATTRACTING FORCE | EFFECT | OPTIMUM ATTRACTING PRESSURE | |
|---|---|---|---|---|---|---|
| | | | | | CONV. CHUCK 101 | WAFER CHUCK 102 |
| 1 | Atmos. Pb | Convey. | Max. | Reliable | P1 | — |
| | " | " | Holding Limit | Throughput | (Diff. Press. 80 Torr) | |
| 2 | " | Transfer | Max. | Reliable | P2 | — |
| | " | " | Holding Limit | Throughput | (Diff. Press. 100 Torr) | |
| 3 | Reduced Pa | Convey. | Max. | Reliable | P3 | P3w |
| | " | " | Holding Limit | Throughput | (Diff. Press. 80 Torr) | (Diff. Press. 50 Torr) |
| 4 | " | Transfer | Max. | Reliable | P4 | P4w |
| | " | " | Holding Limit | Throughput | (Diff. Press. 100 Torr) | (Diff. Press. 70 Torr) |
| 5 | " | Exposure | Max. | Corrective Force | — | P5 (Absolute Pressure 70-80 Torr) |
| | " | " | Holding | Thermal Contact R. Reduced | | |

In Table 1, the optimum attracting pressure P1, P2, P3 and P4) for each operation of the conveying chuck 101 is determined in terms of the differential pressure with respect to the ambience pressure. Also, as for the wafer chuck 102, the optimum attracting pressure (P3w, P4w) for the wafer conveyance or transfer operation is determined in terms of the differential pressure with respect to the ambience pressure while the optimum attracting pressure (P5) for the exposure operation is determined in terms of the absolute pressure.

For example, item "No. 4" defines the optimum attracting pressure P4 of the conveying chuck 101 for its wafer transfer operation (step) to the wafer cassette, to be made in the reduced pressure ambience (in the vacuum chamber 121) as well as the optimum attracting pressure P4w of the wafer chuck 102 for its transfer operation for receiving a wafer from the conveying chuck 101 in the same ambience.

The optimum attracting pressures P4 and P4w of the conveying chuck 101 and the wafer chuck 102, respectively, are determined in terms of the differential pressure with respect to the ambience pressure Pa, as described, and the optimum attracting pressure P4 is set to be equal to a differential pressure 100 Torr to the ambience pressure while the optimum attracting pressure P4w is set to be equal to a differential pressure 70 Torr to the ambience pressure.

The optimum attracting pressures P4 and P4w each is at a level which is in the range between a maximum differential pressure corresponding to the maximum attracting force and the holding limit differential pressure corresponding to the limit attracting force necessary for the attraction of a wafer. This is also true with the case of the remaining steps (operations).

If the attracting pressure is set at a level corresponding to the maximum attracting force, the reliability of substrate holding increases. However, it takes a longer time until the attracting pressure at the wafer attracting surface reaches a level corresponding to the maximum attracting force, and the throughput decreases. Also, if the attracting pressure is set at the holding limit differential pressure, higher throughput is attainable, but the reliability of substrate holding degrades.

Since the conveying chuck 101 and the wafer chuck 102 are different from each other with respect to the area or the surface roughness, the above-described optimum attracting pressures P4 and P4w are so determined, while taking into account this, to sufficiently satisfy both the reliability and the throughput.

The optimum attracting pressure of the wafer chuck 102 in item "No. 5" for the exposure step is determined in terms of the absolute pressure, as described hereinbefore.

As regards the wafer attracting force in the exposure operation, if the attitude correcting force of the wafer attracting surface to a wafer 120 is considered, a larger differential pressure to the ambience pressure is better. However, for reduction in the thermal contact resistance of the wafer attracting surface, a smaller differential pressure is better. In this embodiment, while taking into account the balance of both the attitude correcting force and the thermal contact resistance described, the optimum attracting pressure P5 is set to be equal to an absolute pressure 70-80 Torr to the ambience pressure Pa.

On the other hand, the optimum attracting pressures P1, P3 and P3w in the conveying steps (items No. 1 and No. 3) each is determined while taking into account the area and the surface roughness of the conveying chuck 101 or the wafer chuck 102 as well as the conveying speed thereof and its acceleration until that conveying speed is reached.

On the basis of the set levels memorized in the ROM 118, for each step (operation) the CPU 117 outputs an opening control signal for the restriction valve 113 or 114, to the controller 116. In the case of the exposure operation, the CPU 117 monitors the attracting pressure of the wafer chuck 102 as detected by the second vacuum sensor 112 interposed on the other vacuum line 106 and, while continuing the monitoring, it outputs the opening control signal so that the detected attracting pressure becomes equal to the optimum attracting pressure P5. In the case of any of the other steps (operations), from the attracting pressure of the conveying chuck 101 or of the wafer chuck 102 as detected by the first or second sensor 111 or 112 and from the ambience pressure as detected by a third vacuum sensor 119 which is mounted to the inside wall of the vacuum chamber 121, the CPU calculates a differential pressure and produces an opening control signal by which the differential pressure becomes substantially equal to the set level of the corresponding optimum attracting pressure.

Figure 4A:
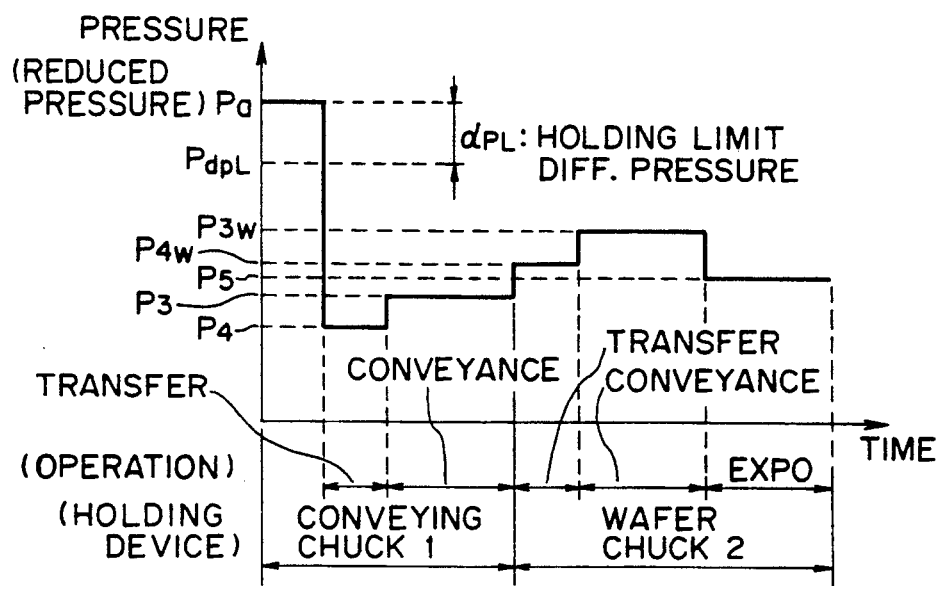
FIGS. 4A and 4B are schematic representations for explaining the attracting pressure controlling operation to be made in the FIG. 3 embodiment, wherein FIG. 4A exemplifies optimum attracting pressures in various steps in a reduced ambience pressure and FIG. 4B exemplifies optimum attracting pressures in some steps in an atmospheric pressure.
Figure 4B:
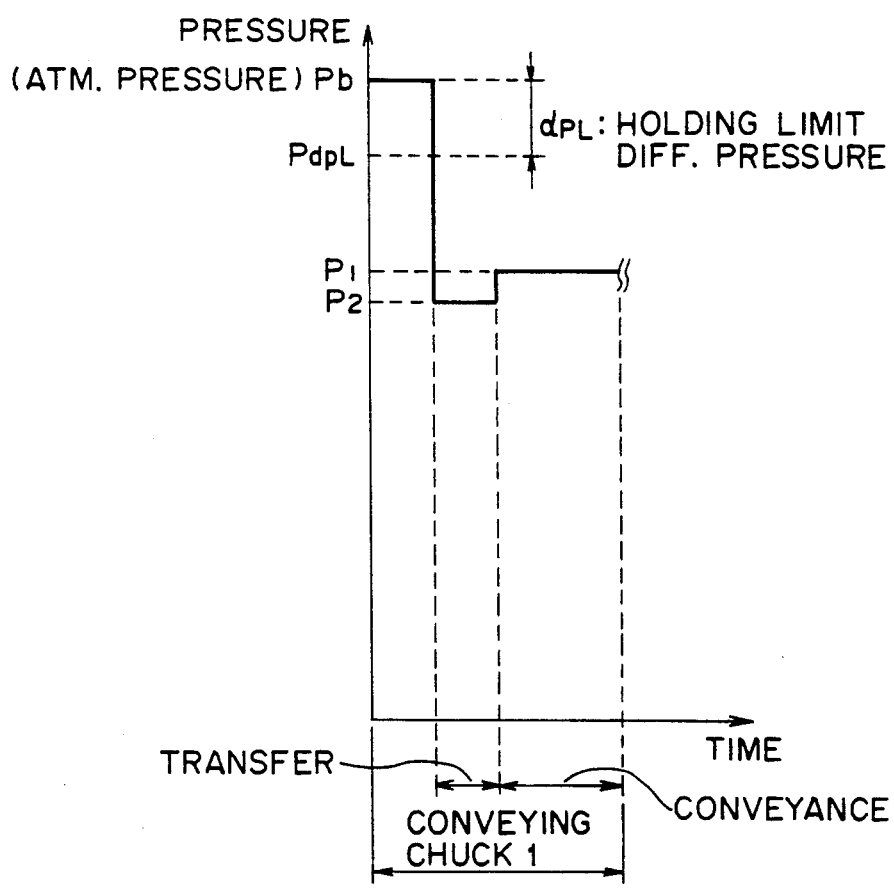

Next, the operation of this embodiment will be explained in conjunction with FIGS. 4A and 4B.

First, by reference to FIG. 4A, the operation until the exposure within a reduced pressure ambience (vacuum chamber 121) will be explained.

The limit differential pressure necessary for attracting a wafer 120 within a reduced ambience pressure Pa (e.g. one hundred and tens Torr) is dPL and, if not greater than a pressure $P_{dPL}$ corresponding to that limit differential pressure, the conveying chuck 101 or the wafer chuck 102 can attract and hold the wafer 120.

In the initial condition, the valves 107 and 108 each is kept in the state (b) and the pressures at the attracting surfaces of the conveying chuck 101 and the wafer chuck 102 are maintained at a level substantially equal to the ambience pressure Pa.

First, the X-stage 103 is moved by an actuator means (not shown) to move the conveying chuck 101 toward the wafer cassette, and the wafer transfer operation for receiving a wafer 120 from the wafer cassette is effected. Subsequently, the pump 110 is energized into a pumping state and the first valve 107 coupled to the conveying chuck 101 is turned into the state (a). By this, the conveying chuck 101 is brought into communication with the pump 110, whereby it can attract the wafer 120. Here, the CPU 117 reads the optimum attracting pressure P4 related to the wafer transfer operation of the conveying chuck 101, out of the ROM 118, and, while monitoring the attracting pressure as detected by the first vacuum sensor 111, it produces and applies an opening control signal to the controller 116 for control of the first restriction valve 113 so that the detected attracting pressure becomes equal to the optimum attracting pressure P4. If in this manner the attracting pressure of the conveying chuck 101 is adjusted and set at the optimum attracting pressure P4 and the wafer 120 is attracted to this chuck, then the X-stage 103 is moved to move the conveying chuck 101 for transfer of the wafer to the wafer chuck 102.

During this movement, the attracting pressure of the conveying chuck 101 is controlled through the CPU 117 in a similar manner, so that it is maintained at the optimum attracting pressure P3 (80 Torr, in Table 1).

When the wafer 120 is conveyed by the operation of the X-stage 103 onto the wafer attraction surface of the wafer chuck 102, the Z-stage 104 is actuated to move the wafer 120 until it contacts the wafer attracting surface of the wafer chuck 102.

If the wafer 120 held by the conveying chuck 101 is brought into contact with the wafer attracting surface of the wafer chuck 102 in the manner described above, the second valve 108 is turned into the state (a) to cause the wafer chuck 102 to attract the wafer 120. Also, at this time, the CPU 117 reads the optimum attracting pressure P4w related to the wafer transfer operation of the wafer chuck 102, out of the ROM 118, and, while monitoring the attracting pressure detected by the second vacuum sensor 112, it produces and applies an opening control signal to the controller 116 for control of the second restriction valve 114 so that the detected attracting pressure becomes equal to the optimum attracting pressure P4w. In this state, the wafer 120 is attracted both by the conveying chuck 101 and by the wafer chuck 102. If the attracting pressure detected by the second vacuum sensor 112 becomes equal to the optimum attracting pressure P4w, then the first valve 107 is turned into the state (b) to release the wafer 120 from the conveying chuck 101. Thus, the wafer 120 is now attracted and held by the wafer chuck 102 only. Thereafter, the Z-stage 104 and the X-stage 103 are actuated to move the conveying chuck 101 back to its original position.

Subsequently, the wafer chuck 102 is moved to convey the wafer 120 to a predetermined exposure position. During this conveyance of the wafer 120, since the optimum attracting pressure of the wafer chuck 102 is P3w (50 Torr, in Table 1), in a similar manner as described the attracting pressure is monitored and controlled through the CPU 117 so that it is maintained at the optimum attracting pressure P3w.

If the wafer 120 reaches the exposure position, in a similar manner as described the attracting pressure of the wafer chuck 102 is monitored and controlled through the CPU 117 so that it becomes equal to and maintained at the optimum attracting pressure P5.

When the exposure of the wafer 120 is completed, the above-described operation is executed in an inverse order, whereby the wafer 120 is transferred to the conveying chuck 101 and, additionally, by this conveying chuck 101 the wafer 120 is moved back into the wafer cassette.

Next, by reference to FIG. 4B, description will be made of a case wherein the ambience pressure is at an atmospheric pressure Pb.

In this case, as described, there may be a wafer transfer operation and a wafer conveyance operation of the conveying chuck 101 in relation to the wafer cassette. The respective optimum attracting pressures are determined as shown in Table 1, at P2 (differential pressure 100 Torr) and P1 (differential pressure 80 Torr), respectively.

Also in this case, like the case of the reduced ambience pressure Pa, by controlling the opening of the first restriction valve 113 by means of the CPU and through the controller 116, for each step (operation) it is possible to set the attracting pressure of the conveying chuck 101 at the level of a corresponding optimum attracting pressure.

With the arrangement of this embodiment of the present invention as described above, the following advantageous effects are obtainable:

(1) For each vacuum attracting type substrate holding means, its substrate attracting surface pressure can be set at an optimum attracting pressure. Therefore, even when plural vacuum attraction type substrate holding means which are different with respect to the area or the surface roughness of the substrate attracting surface are used, it is possible to determine respective optimum attracting pressures while taking into account such differences. Therefore, enhanced reliability of substrate holding is assured.

(2) Further, since for each step an optimum attracting pressure of a vacuum attraction type substrate holding means can be determined, it is possible to make the optimum attracting pressure determination while taking into account the reliability of the substrate holding as well as the enhancement of throughput. Particularly, in the case of the exposure step, it is possible to determine the optimum attracting pressure while taking into account the thermal contact resistance between the substrate and the substrate attracting surface. Therefore, precise temperature control of the substrate is assured.

While the invention has been described with reference to the structures disclosed herein, it is not confined to the details set forth and this application is intended to cover such modifications or changes as may come within the purposes of the improvements or the scope of the following claims.

What is claimed is:

1. A vacuum attraction type substrate holding system, comprising:
   a vacuum source;
   a distributor for distributing a vacuum from said vacuum source into a plurality of vacuum lines;
   a plurality of vacuum attraction type substrate holding portions corresponding to said vacuum lines, respectively, each of said substrate holding portions including a three-way valve for control of a supply of one of a vacuum and an ambience pressure to the corresponding substrate holding portions, wherein the control of each valve is influential to control attraction of a substrate to and release of a substrate from a corresponding substrate holding portion; and
   a plurality of restriction valves each being disposed between said distributor and a corresponding one of said three-way valves, for resisting gas flowing from the corresponding three-way valve.

2. A system according to claim 1, further comprising control means for controlling the opening of each of said restriction valves.

3. A system according to claim 2, wherein said control means controls the opening of each of said restriction valves so that said substrate holding portions have different attracting pressures.

4. A system according to claim 2, wherein said control means controls the opening of at least one of said restriction valves so that the attracting pressure of a corresponding substrate holding portion changes with time.

5. A vacuum attraction type substrate holding system, comprising:
   a vacuum source;
   a distributor for distributing a vacuum from said vacuum source into a plurality of vacuum lines;
   a plurality of vacuum attraction type substrate holding portions corresponding to said vacuum lines, respectively, each of said substrate holding portions including a valve which is openable and closable for control of a supply of a vacuum to the corresponding substrate holding portions, wherein the opening and closing of each valve is influential to control attraction of a substrate to and release of a substrate from a corresponding substrate holding portion;
   a plurality of restriction valves each being disposed between said distributor and a corresponding one of said valves, for resisting gas flowing from the corresponding valve; and
   a plurality of vacuum sensors each being provided between a corresponding one of said valves and a corresponding one of said substrate holding portions, for detecting the attracting pressure of the corresponding substrate holding portion.

6. A system according to claim 5, further comprising control means for controlling the opening of each of said restriction valves on the basis of an output of a corresponding one of said vacuum sensors.

7. A system according to claim 6, further comprising a pressure sensor for detecting an ambience pressure of said substrate holding portions, wherein said control means controls the opening of each restriction valve on the basis of an output of said pressure sensor.

8. A system according to claim 1, further comprising a chamber for accommodating said substrate holding portions and said valves in a predetermined ambience, and wherein said restriction valves are disposed outside said chamber.

9. A system according to claim 8, further comprising control means for controlling the opening of each of said restriction valves.

10. A system according to claim 9, wherein said control means controls the opening of each of said restriction valves so that said substrate holding portions have different attracting pressures.

11. A system according to claim 9, wherein said control means controls the opening of at least one of said restriction valves so that the attracting pressure of a corresponding substrate holding portion changes with time.

12. A system according to claim 8, further comprising a plurality of vacuum sensors each being provided between a corresponding one of said valves and a corresponding one of said substrate holding portions, for detecting the attracting pressure of the corresponding substrate holding portion.

13. A system according to claim 12, further comprising control means for controlling the opening of each of said restriction valves on the basis of an output of a corresponding one of said vacuum sensors.

14. A system according to claim 13, further comprising a pressure sensor for detecting an ambience pressure of said substrate holding portions, and wherein said control means controls the opening of each restriction valve on the basis of an output of said pressure sensor.

15. A system according to claim 8, wherein the inside of said chamber is maintained at a predetermined reduced ambience pressure.

16. A vacuum attraction type substrate holding method, comprising the steps of:
   providing a plurality of vacuum attraction type substrate holding portions each being coupled to a vacuum source and each having a corresponding valve for control of a vacuum supply thereto from the vacuum source;
   providing restriction means for each substrate holding portion, at a position upstream of the corresponding valve with respect to the vacuum supply direction, for restricting flow of the vacuum supply;
   causing a first substrate holding portion to attract a substrate and then causing a second substrate holding portion to attract the same substrate;
   moving the second substrate holding portion to a predetermined position; and
   controlling the restriction of the flow of the vacuum supply by at least one of the restriction means.

17. A method according to claim 16, further comprising providing a resistance to a gas flow form the valve by the restriction means.

18. A method according to claim 16, wherein each restriction means has a variable opening, and further comprising controlling the attracting pressure of a substrate holding portion by controlling the opening of the restriction means.

19. A system according to claim 1, wherein the substrate is a semiconductor wafer and said system is used for manufacturing a semiconductor device.

20. A system according to claim 5, wherein the substrate is a semiconductor wafer and said system is used for manufacturing a semiconductor device.

21. A semiconductor device manufacturing method usable with a wafer, said method comprising the steps of:

providing a plurality of vacuum attraction type wafer holding chucks each being coupled to a vacuum source and each having a corresponding valve for control of a vacuum supply thereto from the vacuum source;

providing restriction means for each wafer holding chuck, at a position upstream of the corresponding valve with respect to the vacuum supply direction, for restricting flow of the vacuum supply;

causing a first wafer holding chuck to attract the wafer and then causing a second wafer holding chuck to attract the same wafer;

moving the second wafer holding chuck to an exposure position; and controlling the restriction of the flow of the vacuum supply by at least one of the restriction means.

* * * * *

UNITED STATES PATENT AND TRADEMARK OFFICE
CERTIFICATE OF CORRECTION

PATENT NO. : 5,203,547  
DATED : April 20, 1993  
INVENTOR(S) : MITSUJI MARUMO

Page 1 of 2

It is certified that error appears in the above-indentified patent and that said Letters Patent is hereby corrected as shown below:

COLUMN 1
    Line 9, "example a." should read --example.--.
    Line 10, "of" should read --of a--.
    Line 35, "comprises" should read --comprise--.

COLUMN 2
    Line 36, "5" should be deleted.

COLUMN 3
    Line 1, "be" should be deleted.
    Line 58, "in" should read --in poor--.

COLUMN 4
    Line 13, "the" should be deleted.
    Line 60, "chucks Il," should read --chucks 11,--.

COLUMN 5
    Line 26, "&he" should read --the--.
    Line 59, "reach" should read --reach a--.
    Line 67, "release," should read --release--.

COLUMN 6
    Line 40, "safe" should read --same--.
    Line 67, "only" should read --only,--.

COLUMN 7
    Line 15, "only" should read --only.--.

UNITED STATES PATENT AND TRADEMARK OFFICE
CERTIFICATE OF CORRECTION

PATENT NO. : 5,203,547
DATED : April 20, 1993
INVENTOR(S) : MITSUJI MARUMO

It is certified that error appears in the above-indentified patent and that said Letters Patent is hereby corrected as shown below:

COLUMN 8
    Line 14, "serves" should read --serve--.
    Line 31, "has" should read --have--.

COLUMN 9
    Line 23, "P1," should read --(P1,--.

COLUMN 11
    Line 14, "is" should read --are--.
    Line 47, "attraction" should read --attracting--.

COLUMN 14
    Line 59, "form" should read --from--.

Signed and Sealed this

Twelfth Day of April, 1994

Attest:

BRUCE LEHMAN

*Commissioner of Patents and Trademarks*

*Attesting Officer*